United States Patent
Powell

(10) Patent No.: US 7,442,655 B2
(45) Date of Patent: Oct. 28, 2008

(54) SELECTIVE OXIDATION METHODS AND TRANSISTOR FABRICATION METHODS

(75) Inventor: Don Carl Powell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 66 days.

(21) Appl. No.: 11/489,051

(22) Filed: Jul. 18, 2006

(65) Prior Publication Data

US 2006/0258171 A1  Nov. 16, 2006

Related U.S. Application Data

(63) Continuation of application No. 10/688,748, filed on Oct. 17, 2003, now Pat. No. 7,235,497.

(51) Int. Cl.
*H01L 21/31* (2006.01)
*H01L 21/469* (2006.01)

(52) U.S. Cl. .............................. 438/770; 257/E21.494; 438/768; 438/773

(58) Field of Classification Search .......... 257/E21.494; 438/770, 771, 773, 769; 439/768
See application file for complete search history.

(56) References Cited

U.S. PATENT DOCUMENTS

| | | | |
|---|---|---|---|
| 5,739,066 A | 4/1998 | Pan | 438/595 |
| 6,114,258 A | 9/2000 | Miner et al. | 438/787 |
| 6,114,735 A | 9/2000 | Batra et al. | 257/411 |
| 6,171,104 B1 * | 1/2001 | Saito et al. | 432/18 |
| 6,335,254 B1 | 1/2002 | Trivedi | 438/305 |
| 6,534,401 B2 | 3/2003 | Joo et al. | 438/653 |
| 6,774,012 B1 * | 8/2004 | Narayanan | 438/471 |
| 2002/0127888 A1 | 9/2002 | Cho et al. | 438/900 |
| 2004/0121569 A1 | 6/2004 | Storbeck et al. | 438/585 |
| 2004/0137755 A1 * | 7/2004 | Herring et al. | 438/770 |

OTHER PUBLICATIONS

Hiura et al., *Integration Technorology of Polymetal (W/WSiN/Poly-Si) Dual Gate CMOS for 1 Gbit DRAMs and Beyond*, IEEE 398-392 (Sep. 1998).
Kawada et al., *Water Vapor Generator by Catalytic Reactor* (pre-Feb. 2001).

(Continued)

*Primary Examiner*—Caridad M Everhart
(74) *Attorney, Agent, or Firm*—Wells St. John P.S.

(57) ABSTRACT

The invention includes selective oxidation methods and transistor fabrication methods. In one implementation, a selective oxidation method includes positioning a substrate within a chamber. The substrate has first and second different oxidizable materials. The substrate is therein exposed to a gas mixture comprising an oxidizer and a reducer under conditions effective to selectively grow an oxide layer on the first material relative to the second material. The oxidizer oxidizes the first and second materials under the conditions. The reducer reduces oxidized second material under the conditions back to the second material. After selectively growing the oxide layer on the first material relative to the second material, partial pressure of the oxidizer and the reducer is reduced within the chamber by flowing an inert gas to the chamber while chamber pressure and chamber temperature are at or above those of the conditions during the exposing. Other aspects and implementations are contemplated.

16 Claims, 1 Drawing Sheet

OTHER PUBLICATIONS

Lee et al., In-situ *Barrier Formation for High Reliable W/barrier/poly-Si Gate Using Denudation of $WN_x$ on Polycrystalline Si*, IEEE 385-388 (Sep. 1998).

Nagahama et al., *Wet Hydrogen Oxidation System for Metal gate LSI's* (pre-Feb. 2001).

Ohnishi et al., *Improving gate oxide integrity (GOI) of a W/WNx/dual-poly Si stacked-gate by using Wet-Hydrogen oxidation in 0.14-μm CMOS devices*, IEEE 397-400 (Sep. 1998).

Wakabayashi et al., *An Ultra-Low Resistance and Thermal Stable W/pn-Poly-Si gate CMOS Technology using Si/TiN Buffer Layer*, IEEE 393-396 (Sep. 1998).

* cited by examiner

SELECTIVE OXIDATION METHODS AND TRANSISTOR FABRICATION METHODS

RELATED PATENT DATA

This patent resulted from a continuation application of U.S. patent application Ser. No. 10/688,784, filed Oct. 17, 2003, now U.S. Pat. No. 7,235,497 entitled "Selective Oxidation Methods and Transistor Fabrication Methods", naming Don C. Powell as inventor, the disclosure of which is incorporated by reference.

TECHNICAL FIELD

This invention relates to selective oxidation methods and to transistor fabrication methods.

BACKGROUND OF THE INVENTION

One type of circuitry device is a field effect transistor. Typically, such includes opposing semiconductive material source/drain regions of one conductivity type having a semiconductive channel region of opposite conductivity type therebetween. A gate construction is received proximate the channel region, typically between the source/drain regions. The gate construction typically includes a conductive region having a thin dielectric layer positioned between the conductive region and the channel region. Current can be caused to flow between the source/drain regions through the channel region by applying a suitable voltage to the conductive portion of the gate.

Typical transistor fabrication methods include a step referred to as source/drain re-oxidation. Such may be conducted by any of a number of reasons depending upon the materials, sequence and manner by which transistor components have been fabricated prior to the re-oxidation step. For example, one method of providing a gate dielectric layer is to thermally grow an oxide over a bulk or semiconductor-on-insulator substrate. In certain instances, source/drain regions are provided by conducting ion implantation through this oxide layer after the gate construction has been patterned to at least partially form the source/drain regions. The heavy source/drain implant is likely to damage and contaminate the oxide remaining over the source/drain regions. Even if all the oxide were removed over the source/drain regions prior to the implant, damage to the crystal lattice and the source/drain outer surface typically occurs from the source/drain implant(s). Accordingly and regardless, a re-oxidation step is conducted to grow a fresh, uncontaminated oxide on the source/drain regions towards repairing certain damage caused by the implant. This typically occurs after any remaining damaged oxide has been stripped from over the source/drain regions.

Typically, this re-oxidation also grows a very thin thermal oxide on tops and sidewalls of the conductive components of the gate construction. Further, it tends to slightly thicken the gate oxide under the gate corners, and thereby round the lower outer edges of the typical polysilicon material of the gate. The ion implantation and any oxide stripping can weaken or mechanically compromise the gate oxide at the sidewall edges of the gate, and tend to increase the field effect transistor gate-to-drain overlap capacitance. The thickening and rounding of the gate oxide at the corners can reduce gate-to-drain overlap capacitance, and relieve the electric-field intensity at the corner of the gate structure, thus enhancing the gate oxide integrity at its edge. Further, the thermal oxide can serve as a dopant diffusion mask preventing dopant diffusion from subsequently deposited insulative interlevel dielectric layers.

However in many instances, it is desirable that none or a minimum of certain conductive materials of the transistor gates be oxidized. For example, one presently employed gate construction uses polysilicon, tungsten nitride and elemental tungsten as conductive materials. When using steam as a source/drain re-oxidant, the conditions would also tend to significantly oxidize the elemental tungsten. A prior art technique to minimize the effective formation of tungsten oxide on the tungsten is to provide $H_2$ in combination with steam in the oxidizing atmosphere. The $H_2$ tends to reduce the tungsten oxide back to tungsten, thus reducing or minimizing the amount of tungsten oxide which forms on the sidewalls of the tungsten material.

Some of the tungsten oxide which forms is in the vapor phase, with the oxidation/reduction reaction essentially being one of equilibrium with $H_2$ and $H_2O$. Unfortunately, tungsten oxide tends to deposit on internal reactor surfaces largely at the conclusion of the source/drain re-oxidation. Such requires periodic cleaning of the internal reactor components, thus reducing production time of the reactors. One prior art technique for increasing the time between cleanings is to reduce flow of steam to the reactor prior to reducing flow of the $H_2$.

The invention was motivated in addressing the above described issues, but however is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes selective oxidation methods and transistor fabrication methods. In one implementation, a selective oxidation method includes positioning a substrate within a chamber. The substrate has first and second different oxidizable materials. The substrate is exposed within the chamber to a gas mixture comprising an oxidizer and a reducer under conditions effective to selectively grow an oxide layer on the first material relative to the second material. The oxidizer oxidizes the first and second materials under the conditions. The reducer reduces oxidized second material under the conditions back to the second material. After selectively growing the oxide layer on the first material relative to the second material, partial pressure of the oxidizer and the reducer is reduced within the chamber by flowing an inert gas to the chamber while chamber pressure and chamber temperature are at or above those of the conditions during the exposing.

In one implementation, a transistor fabrication method includes forming a transistor gate comprising semiconductive material and conductive metal. Source/drain regions are formed proximate the transistor gate. The transistor gate and source/drain regions are exposed to a gas mixture comprising $H_2O$ and $H_2$ within a chamber under conditions effective to oxidize outer surfaces of the source/drain regions. After oxidizing the outer surfaces of the source/drain regions, partial pressure of the $H_2O$ and the $H_2$ within the chamber is reduced by flowing an inert gas to the chamber while chamber pressure and chamber temperature are at or above those of the conditions during the exposing.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Preferred embodiments of selective oxidation methods are described with reference to FIGS. 1 and 2. the invention was reduced-to-practice in the fabrication of field effect transistors, as is described with reference to FIGS. 1 and 2. However, the invention has applicability in selective oxidation methods involving any substrate, and in the fabrication of any circuitry or non-circuitry component or device.

Figure 1:
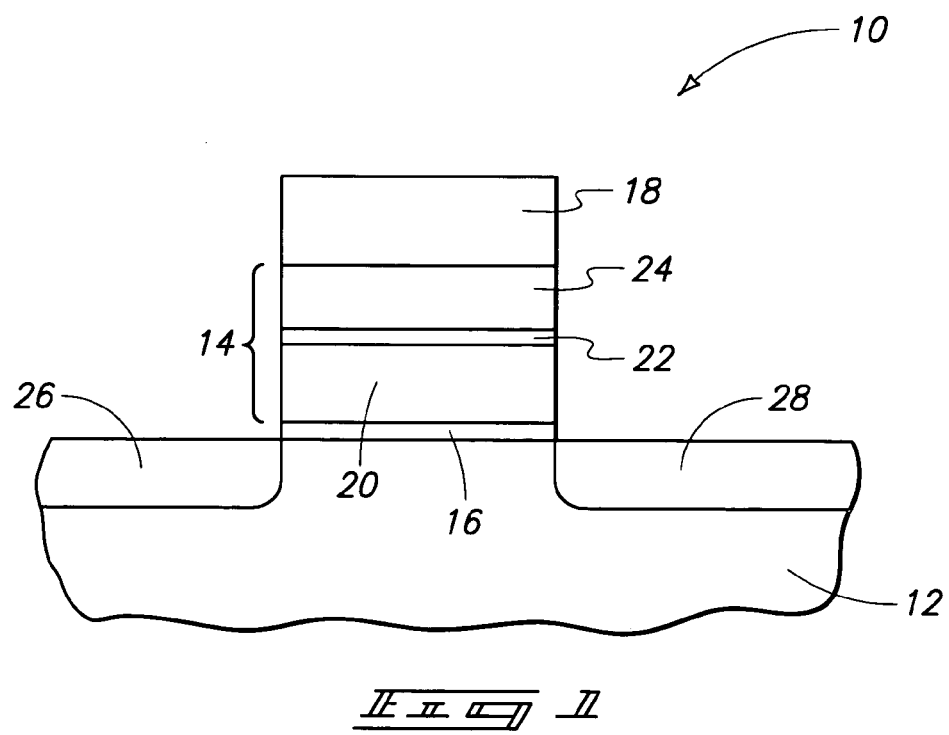
FIG. 1 is a diagrammatic sectional view of an exemplary substrate fragment at a processing step in accordance with an aspect of the invention.

Referring initially to FIG. 1, a semiconductor substrate is shown. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated.

The semiconductor substrate comprises an exemplary bulk substrate material 12, for example monocrystalline silicon. Of course, other materials and substrates are contemplated, including semiconductor-on-insulator and other substrates whether existing or yet-to-be developed.

A transistor gate construction 10 is formed over substrate 12. By way of example only, such includes a conductive transistor gate 14 sandwiched between a pair of dielectric layers 16 and 18. Dielectric layer 16 serves as a gate dielectric, with a preferred exemplary material being thermally grown silicon dioxide having a thickness of from 25 Angstroms to 70 Angstroms. Typically, insulative layer 18 serves as an insulative cap, with exemplary preferred materials being silicon nitride and/or undoped silicon dioxide provided to an exemplary thickness of from 700 Angstroms to 1,100 Angstroms. Transistor gate 14 comprises at least a semiconductive material and a conductive metal. In the context of this document, a "metal" includes any of an elemental metal, an alloy of at least two elemental metals, and metal compounds whether stoichiometric or not stoichiometric. Example preferred metals include W, Pt, Co, Mo, Pd, Cu, Al, Ta, Ti, WN, and conductive metal oxides, by way of example only. Further by way of example only, exemplary semiconductive materials include conductively doped silicon, for example polysilicon.

The exemplary embodiment transistor gate 14 is illustrated as comprising three layers 20, 22 and 24. An exemplary material 20 is conductively doped polysilicon deposited to an exemplary thickness of from 250 Angstroms to 750 Angstroms. An exemplary material for layer 22 is tungsten nitride provided in a 1:1 atomic ratio of tungsten to nitrogen, and to an exemplary thickness range of from 80 Angstroms to 100 Angstroms. An exemplary preferred material for layer 24 is elemental tungsten deposited to an exemplary thickness range of from 200 Angstroms to 400 Angstroms.

The illustrated layers 16, 20, 22, 24 and 18 would typically be successively formed over a substrate and then collectively patterned to form the illustrated gate construction 10, for example by photolithography and tech. FIG. 1 depicts source/drain regions 26 and 28 being formed proximate transistor gate 14. In the context of the illustrated preferred embodiment and invention, the formation of the source/drain regions at this point in the process might be only partial or might be complete. For example, source/drain regions of field effect transistors typically include multiple different concentration, and sometimes even conductivity type, implants. Examples include LDD, primary highest dose implants, halo regions, etc. Typical exemplary methods of forming such regions include ion implantation, gas dopant diffusion, and out-diffusion from adjacent solid materials. In the context of this document, any degree of formation of the source/drain regions is contemplated, whether partial or complete, and whether by any existing or yet-to-be developed processes. Further and by way of example only, some, all or none of gate dielectric layer 16 might be removed laterally outside of the pattern depicted by gate construction 10 prior to one or more of the processing which results in the partial or complete formation of the source/drain regions.

The substrate would be positioned within a suitable chamber. In a broader context of the invention related to selective oxidation methods, the substrate, as positioned within the chamber, would comprise first and second different oxidizable materials that will be oxidized to some degree, as described below. By way of example only with respect to the FIG. 1 embodiment, one or both of materials 20 and 12/26/28 could be considered as a first oxidizable material, with layer 24 constituting an exemplary second different oxidizable material.

Within the chamber, the substrate is exposed to a gas mixture comprising an oxidizer and a reducer under conditions effective to selectively grow an oxide layer on the first material relative to the second material. In the context of this document, selective growth on one material relative to another is defined as a differential growth rate on the one of at least two times the growth rate on the another. Under the conditions within the chamber, the oxidizer oxidizes the first and second oxidizable materials. The reducer reduces at least some of the oxidized second material under the conditions back to the second material. The selected conditions for the exposing will, in large part, depend upon the first and second different oxidizable materials on the substrate, as well as upon the oxidizer and reducer which are utilized. Of course, the use of more than one oxidizer or more than one reducer is also contemplated.

By way of example only, consider substrate material 12/26/28 as constituting a first oxidizable material and an elemental tungsten layer 24 as constituting a second oxidizable material. Such are shown in the illustrated FIG. 1 example as having at least some portion thereof outwardly exposed. However, the invention also contemplates none of such layers being outwardly exposed as long as any covering material is diffusive of the oxidizer and reducer under the conditions to at least a degree to enable the stated oxidizing and reducing effects. Regardless, an exemplary oxidizer in such a system is $H_2O$ and an exemplary reducer is $H_2$. Under suitable conditions, the $H_2O$ will tend to oxidize both the silicon of materials 12/26/28 and polysilicon 20, as well as the elemental tungsten of layer 24. Some of the oxidized tungsten will tend to form a layer (not shown) on the sidewalls of layer 24, as well as form $WO_x$ in vaporized form within the chamber. However under suitable conditions, the $H_2$ will have a greater tendency to reduce the WOx back to elemental tungsten such that very little solid WOx forms on the sidewalls of layer 24. As described below, reduction-to-practice examples resulted in a 50:1 and greater selective deposition of an oxide on the silicon surfaces as compared to those of the tungsten surfaces.

By way of example only, exemplary alternate different second oxidizable materials include tantalum and hafnium containing materials, while different alternate first oxidizable materials include gallium arsenide and silicon-germanium alloys. Further by way of example only, an exemplary alternate oxidizer utilizable with such materials would be $CO_2$, with an exemplary alternate reducer for such materials being CO.

Exemplary preferred conditions include rapid thermal processing. Further, the conditions might comprise a pressure below, at or greater than room ambient pressure. When greater than ambient room pressure, in one preferred embodiment, the pressure is no greater than 1.25 times room ambient pressure in Torr and, in a more preferred embodiment no greater than 1.21 times room ambient pressure in Torr. Of course, significantly higher pressures are also contemplated. However, a preferred reason for operating at such pressures only slightly elevated from ambient room pressure is to preclude room ambient oxygen from entering the chamber in the event of a leak, which might introduce processing variability and/or safety issues. Further, operating at such preferred slightly elevated pressures might in certain instances enable such processing advantages while using processing equipment primarily designed to operate at room ambient pressure conditions.

Figure 2:
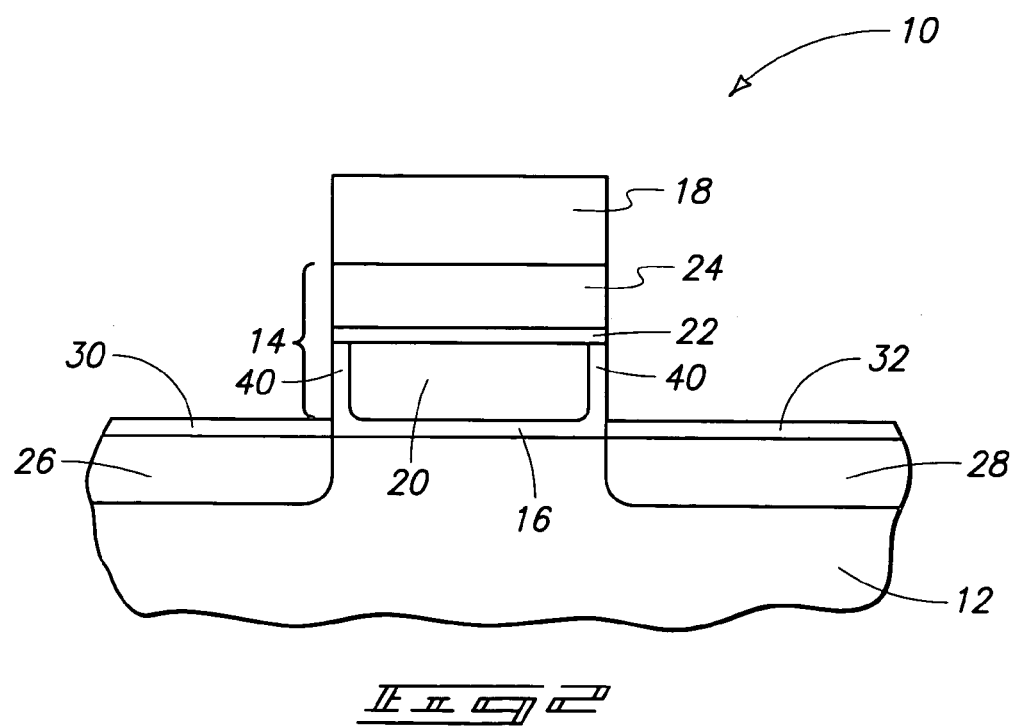
FIG. 2 is a view of the FIG. 1 substrate at a processing step subsequent to that shown by FIG. 1.

FIG. 2 depicts a preferred result in the formation of oxide layers 30 and 32 over source/drain regions 26 and 28. Such rounds the outer lateral edges of gate oxide layer 16, and oxidizes the polysilicon sidewalls, forming oxide regions 40. Preferably, very little if any oxide forms on the sidewalls of the exemplary exposed tungsten layer 24.

In a first implementation and regardless of pressure, after selectively growing the oxide layer on the first material relative to the second material, partial pressure of the oxidizer and the reducer are reduced within the chamber by flowing an inert gas to the chamber while chamber pressure and chamber temperature are at or above those of the conditions during the exposing. The gas mixture might be void of any inert gas during the exposing immediately prior to the partial pressure reducing. Alternately, the gas mixture might comprise inert gas during the conditions immediately prior to the partial pressure reducing. In such latter instance, the partial pressure reducing would comprise increasing the flow of inert gas (either with the same, fewer, or additional inert gases) to the chamber from what it was immediately prior to the partial pressure reducing. As identified in the background section, the prior art is recognized to have reduced partial pressure of the oxidizer only by reducing the flow of the oxidizer to the chamber, but not by the act of flowing an inert gas to the chamber.

In one aspect, after the partial pressure reducing by the act of flowing an inert gas (and meaning regardless of whether inert gas is flowing immediate prior to the partial pressure reducing), the flow of the reducer to the chamber is reduced prior to reducing the flow of the oxidizer to the chamber. In such instance, the flow of the reducer to the chamber might be stopped completely prior to reducing the flow of the oxidizer to the chamber, or not stopped completely prior to reducing the flow of the oxidizer to the chamber.

Alternately by way of example only, after the partial pressure reducing by the act of flowing an inert gas, aspects of the invention contemplate reducing the flow of the oxidizer to the chamber prior to reducing the flow of the reducer to the chamber. Further, the flow of the oxidizer to the chamber might be stopped completely prior to reducing the flow of the reducer to the chamber, or not stopped completely prior to reducing the flow of the reducer to the chamber. Alternately by way of example only, after the partial pressure reducing by the act of flowing an inert gas, the flow of the oxidizer and the reducer to the chamber might be reduced simultaneously.

In one implementation, where the conditions comprise pressure greater than room ambient pressure, the method further comprises reducing pressure to below room ambient pressure after the partial pressure reducing. In such implementation, the flow of the reducer to the chamber might be reduced prior to the pressure reducing, including reducing the reducer flow to zero prior to the pressure reducing. Further, the flow of the oxidizer might be reduced prior to the pressure reducing, including reduction to zero flow. Further, both reducer and oxidizer might be reduced prior to reducing the pressure to below room ambient pressure after the partial pressure reducing, or neither might be reduced.

In one exemplary reduction-to-practice example, processing in accordance with the invention was carried out in an Applied Materials Centura, 3.5 Liters, single wafer, rapid thermal processor. An exposed refractory metal was on the substrate, as well as exposed silicon. An argon purge of the chamber was conducted initially at a flow of from 5 slm to 10 slm for from 5 to 30 seconds at a substrate temperature of below 300° C. and a chamber pressure of from 1 Torr to 2 Torr. $H_2$ flow to the chamber was added after 20 seconds under the purge conditions. A preferred volumetric flow would be from 30% to 50% by volume of hydrogen compared to the total quantity of hydrogen and argon flowed to the chamber. Thirty percent (30%) was utilized in a preferred reduction to practice example. The substrate was then heated to 900° C., with an exemplary preferred temperature range being from 800° C. to 1050° C. The temperature increase ramp rate was approximately 75° C./second. Pressure was also increased to 820 Torr, while room ambient pressure was 680 Torr. Such processing preferably continues for from 1 second to 10 seconds. Argon flow to the chamber was then turned off, and $H_2O$ flow to the chamber was introduced. The preferred volumetric flow of the $H_2O$ is from 5% to 50% by volume of the combined $H_2$ and $H_2O$ flows, with 35% $H_2O$ being used in a preferred reduction to practice example. Temperature was maintained at 900° C., with chamber pressure at 820 Torr. An exemplary preferred processing time is anywhere from 5 seconds to 5 minutes to result in selective oxide growth, for example as shown in FIG. 2.

After the selective oxide growth has been accomplished to a degree desired, an inert gas, such as argon, was flowed to the chamber while chamber pressure and chamber temperature are at or above those of the conditions during the exposing, for example in the preferred embodiment example while the chamber was at 900° C. and the pressure was at 820 Torr. In the specific reduction-to-practice example, argon was flowed to the chamber until reaching an argon flow rate of 10 slm while flowing the $H_2O$ and $H_2$ at their previous volumetric ratio relative to one another, for example at a 65:35 ratio of $H_2$ to $H_2O$. Such argon flow thereby reduced the partial pressure of the oxidizer and the reducer within the chamber by the act of flowing the inert gas thereto. Of course if inert gas were flowing immediately prior to the partial pressure reducing, such act could be effected by increasing total inert gas flow to the chamber. An exemplary desireable or preferred argon flow rate is 70% by volume, as compared to the flow rate of all gases to the chamber. In one preferred implementation, the argon was brought up to a stable flow rate in a short period of time, for example from 2 to 3 seconds. In such preferred embodiment, the $H_2$ flow is then preferably reduced to zero over 1 to 10 seconds, with 5 seconds being a specific reduction-to-practice example. Thereafter, in one preferred implementation, chamber pressure is brought down to below room ambient pressure, for example, and by way of example only, to a pressure of from 600 Torr to 1 Torr while the argon and $H_2O$ continues to flow to the chamber. A reason for doing so would be to improve removal of residual gases, including for example $WO_x$.

Thereafter, flow of the $H_2O$ to the chamber was turned off. Accordingly in this reduction-to-practice example, flow of the oxidizer and the reducer to the chamber is ultimately reduced to zero. Thereafter if desired, the $H_2$ as a reducer can be fed to the chamber. A possible reason for doing so would be towards reducing any remaining solid tungsten oxide back to tungsten.

In one preferred implementation, the chamber could then be cooled down to below the exposing conditions which produced the selective oxidization.

The above provides but one, preferred, reduction to practice example.

In a second implementation, a selective oxidization method comprises exposing the substrate within the chamber to a gas mixture comprising the oxidizer and the reducer under conditions effective to selectively grow an oxide layer on the first material relative to the second material, where the conditions comprise pressure greater than room ambient pressure. After selectively growing the oxide layer on the first material relative to the second material, partial pressure of the oxidizer and the reducer is reduced within the chamber by flowing in an inert gas to the chamber while chamber pressure is greater than room ambient pressure, and independent of maintenance or changing of the temperature to above or below that of the conditions during the exposing. After the partial pressure reducing, chamber pressure is reduced to below room ambient pressure within the chamber while flowing the reducer and the oxidizer to the chamber. All other preferred aspects of the processing could be conducted as described above.

The above-described processing can be utilized in transistor fabrication methods, for example as described and shown. Further, the invention contemplates transistor fabrication methods employing $H_2O$ and $H_2$ regardless of selective oxidization issues, and regardless of whether conductive metal of the transistor gate is oxidizable under the conditions which oxidize outer surfaces of source/drain regions. For example, in one implementation, the invention contemplates exposing the transistor gate and source/drain regions to a gas mixture comprising $H_2O$ and $H_2$ within the chamber under conditions effective to oxidize the outer surfaces of the source/drain regions. After oxidizing the outer surfaces of the source/drain regions, partial pressure of the $H_2O$ and the $H_2$ within the chamber is reduced by the act of flowing an inert gas to the chamber while chamber pressure and chamber temperature are at or above those of the conditions during the exposing. Of course, all other preferred aspects of the processing could be conducted as described above.

Further in one implementation, the invention contemplates exposing the transistor gate and the source/drain regions to a gas mixture comprising $H_2O$ and $H_2$ within a chamber under conditions effective to oxidize the outer surfaces of the source/drain regions, where the conditions comprise pressure greater than room ambient pressure. After oxidizing the outer surfaces of the source/drain regions, partial pressure of the $H_2O$ and the $H_2$ within the chamber are reduced by the act of flowing an inert gas to the chamber while chamber pressure is greater than room ambient pressure. After such partial pressure reducing, chamber pressure is reduced to below room ambient pressure while flowing $H_2O$ and $H_2$ to the chamber, for example at, above or below the flowing amounts during the exposing conditions. Of course, all other preferred aspects of the processing could be conducted as described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A selective oxidation method comprising:
   providing a substrate within a chamber, the substrate comprising first and second different oxidizable materials, the first and second materials having covering material thereover;
   exposing the substrate within the chamber to a gas mixture comprising an oxidizer and a reducer under conditions effective to selectively grow an oxide layer on the first material relative to the second material, the oxidizer and reducer diffusing through at least some of said covering material with the oxidizer oxidizing the first and second materials under the conditions, the reducer reducing oxidized second material under the conditions back to the second material; and
   after selectively growing the oxide layer on the first material relative to the second material and while exposing the substrate to the oxidizer and the reducer within the chamber, reducing partial pressure of the oxidizer and the reducer within the chamber by flowing an inert gas to the chamber while chamber pressure and chamber temperature are at or above those of the conditions during the exposing.

2. The method of claim 1 wherein the first material comprises silicon and the second material comprises a metal in at least one of elemental or alloy forms.

3. The method of claim 1 wherein the gas mixture is void of any inert gas immediately prior to said partial pressure-reducing.

4. The method of claim 1 wherein the gas mixture comprises inert gas immediately prior to said partial pressure-reducing, said partial pressure-reducing comprising increasing inert gas flow to the chamber from what it was immediately prior to said partial pressure-reducing.

5. The method of claim 1 wherein the conditions comprise a pressure below room ambient pressure.

6. The method of claim 1 wherein the conditions comprise pressure greater than room ambient pressure.

7. The method of claim 1 wherein after the partial pressure-reducing by flowing an inert gas, reducing flow of the reducer to the chamber prior to reducing flow of the oxidizer to the chamber.

8. The method of claim 1 wherein after the partial pressure-reducing by flowing an inert gas, reducing flow of the oxidizer to the chamber prior to reducing flow of the reducer to the chamber.

9. The method of claim 1 wherein after the partial pressure-reducing by flowing an inert gas, reducing flow of the oxidizer and the reducer to the chamber simultaneously.

10. The method of claim 1 wherein the conditions comprise pressure greater than room ambient pressure, the method further comprises reducing chamber pressure to below room ambient pressure after said partial pressure-reducing.

11. A selective oxidation method comprising:
providing a substrate within a chamber, the substrate comprising first and second different oxidizable materials, the first and second materials having covering material thereover;
exposing the substrate within the chamber to a gas mixture comprising an oxidizer and a reducer under conditions effective to selectively grow an oxide layer on the first material relative to the second material, the oxidizer and reducer diffusing through at least some of said covering material with the oxidizer oxidizing the first and second materials under the conditions, the reducer reducing oxidized second material under the conditions back to the second material, the conditions comprising pressure greater than room ambient pressure;
after selectively growing the oxide layer on the first material relative to the second material and while exposing the substrate to the oxidizer and the reducer within the chamber, reducing partial pressure of the oxidizer and the reducer within the chamber by flowing an inert gas to the chamber while chamber pressure is greater than room ambient pressure and while chamber temperature is at or above that of the conditions during the exposing; and
reducing pressure to below room ambient pressure within the chamber after said partial pressure-reducing while flowing the reducer and the oxidizer to the chamber.

12. The method of claim 11 wherein the gas mixture is void of any inert gas immediately prior to said partial pressure-reducing.

13. The method of claim 11 wherein the gas mixture comprises inert gas immediately prior to said partial pressure-reducing, said partial pressure-reducing comprising increasing inert gas flow to the chamber from what it was immediately prior to said partial pressure-reducing.

14. The method of claim 11 wherein the conditions pressure is no greater than 1.25 times room ambient pressure in Torr.

15. A transistor fabrication method, comprising:
forming a transistor gate comprising semiconductive material and conductive metal;
forming source/drain regions proximate the transistor gate;
exposing the transistor gate and source/drain regions to a gas mixture comprising an oxidizer and a reducer within a chamber under conditions effective to oxidize outer surfaces of the source/drain regions; and
after oxidizing the outer surfaces of the source/drain regions and while exposing the substrate to the oxidizer and the reducer within the chamber, reducing partial pressure of the oxidizer and the reducer within the chamber by flowing an inert gas to the chamber while chamber pressure and chamber temperature are at or above those of the conditions during the exposing.

16. A transistor fabrication method, comprising:
forming a transistor gate comprising semiconductive material and conductive metal;
forming source/drain regions proximate the transistor gate;
exposing the transistor gate and source/drain regions to a gas mixture comprising an oxidizer and a reducer within a chamber under conditions effective to oxidize outer surfaces of the source/drain regions, the conditions comprising pressure greater than room ambient pressure; and
after oxidizing the outer surfaces of the source/drain regions and while exposing the substrate to the oxidizer and the reducer within the chamber, reducing partial pressure of the oxidizer and the reducer within the chamber by flowing an inert gas to the chamber while chamber pressure is greater than room ambient pressure and while chamber temperature is at or above that of the conditions during the exposing; and
reducing pressure to below room ambient pressure within the chamber after said partial pressure-reducing while flowing the oxidizer and the reducer to the chamber.

* * * * *

UNITED STATES PATENT AND TRADEMARK OFFICE
CERTIFICATE OF CORRECTION

| | | |
|---|---|---|
| PATENT NO. | : 7,442,655 B2 | Page 1 of 1 |
| APPLICATION NO. | : 11/489051 | |
| DATED | : October 28, 2008 | |
| INVENTOR(S) | : Powell | |

It is certified that error appears in the above-identified patent and that said Letters Patent is hereby corrected as shown below:

In column 1, line 7, delete "10/688,784," and insert -- 10/688,748, --, therefor.

Signed and Sealed this

Twenty-fourth Day of February, 2009

JOHN DOLL
*Acting Director of the United States Patent and Trademark Office*